United States Patent
Liu et al.

(10) Patent No.: US 8,723,714 B2
(45) Date of Patent: May 13, 2014

(54) MULTIPLYING DIGITAL-TO-ANALOG CONVERTERS AND PIPELINE ANALOG-TO-DIGITAL CONVERTER USING THE SAME

(75) Inventors: Cong Liu, Anhui (CN); Yu-Kai Chou, Hsinchu (TW)

(73) Assignee: Mediatek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/567,777

(22) Filed: Aug. 6, 2012

(65) Prior Publication Data

US 2013/0033391 A1 Feb. 7, 2013

Related U.S. Application Data

(60) Provisional application No. 61/515,614, filed on Aug. 5, 2011.

(30) Foreign Application Priority Data

Jan. 20, 2012 (CN) .......................... 2012 1 0019292

(51) Int. Cl.
*H03M 1/38* (2006.01)

(52) U.S. Cl.
USPC .......................... 341/161; 341/155

(58) Field of Classification Search
USPC .......................... 341/155, 161, 172
See application file for complete search history.

(56) References Cited

U.S. PATENT DOCUMENTS

| | | | | |
|---|---|---|---|---|
| 6,342,919 B2 * | 1/2002 | Opris | ............................ | 348/241 |
| 7,009,549 B1 * | 3/2006 | Corsi | ............................ | 341/161 |
| 7,233,276 B1 * | 6/2007 | Huang | .......................... | 341/163 |
| 7,242,331 B1 * | 7/2007 | Lin | ................................ | 341/118 |

* cited by examiner

*Primary Examiner* — Brian Young
(74) *Attorney, Agent, or Firm* — McClure, Qualey & Rodack, LLP (57) ABSTRACT

A multiplying digital-to-analog converter (MDAC) is provided. The MDAC includes a sub DAC decoding circuit, a capacitor-switch circuit, and an operation amplifier circuit. The capacitor-switch circuit includes at least two sampling capacitor sets which are coupled in parallel. The number of sampling capacitors in one of the sampling capacitor sets is larger than or equal to two. Each sampling capacitor set is coupled to an analog-signal input quantity through a sampling switch and to a corresponding output terminal of the sub DAC decoding circuit through a decoding switch. The sub DAC decoding circuit decodes a digital quantity and outputs a corresponding analog signal at each output terminal, such that the corresponding analog signals are applied to the respective sampling capacitor sets through the decoding switches and summed by the respective sampling capacitor sets to obtain an analog-signal quantity corresponding to the digital quantity.

12 Claims, 7 Drawing Sheets

MULTIPLYING DIGITAL-TO-ANALOG CONVERTERS AND PIPELINE ANALOG-TO-DIGITAL CONVERTER USING THE SAME

CROSS REFERENCE TO RELATED APPLICATIONS

This application claims the benefit of U.S. Provisional Application No. 61/515,614, filed on Aug. 5, 2011, the contents of which are incorporated herein by reference.

This Application claims priority of China Patent Application No. 201210019292.4, filed on Jan. 20, 2012, the entirety of which is incorporated by reference herein.

BACKGROUND OF THE INVENTION

1. Field of the Invention

The invention relates to an analog-to-digital converter, and more particularly to a multiplying digital-to-analog converter with shared switches and a pipeline analog-to-digital converter using the same.

2. Description of the Related Art

In portable digital multimedia consumer electronic systems, analog-to-digital converters (referred to as ADCs) with high speed and low power consumption are required to process analog signals. Pipeline ADCs are ADCs with pipeline structures which can achieve high speed and high precision. The pipeline ADCs have sampling rates reaching dozens of trillions of sampled points per second; even reaching hundreds of trillions of sampled points per second. That is, the sampling rates are dozens of MS/s; even hundreds of MS/s. This characteristic is advantageous for pipeline ADCs, so pipeline ADCs are commonly used in consumer electronic systems.

Figure 1A:
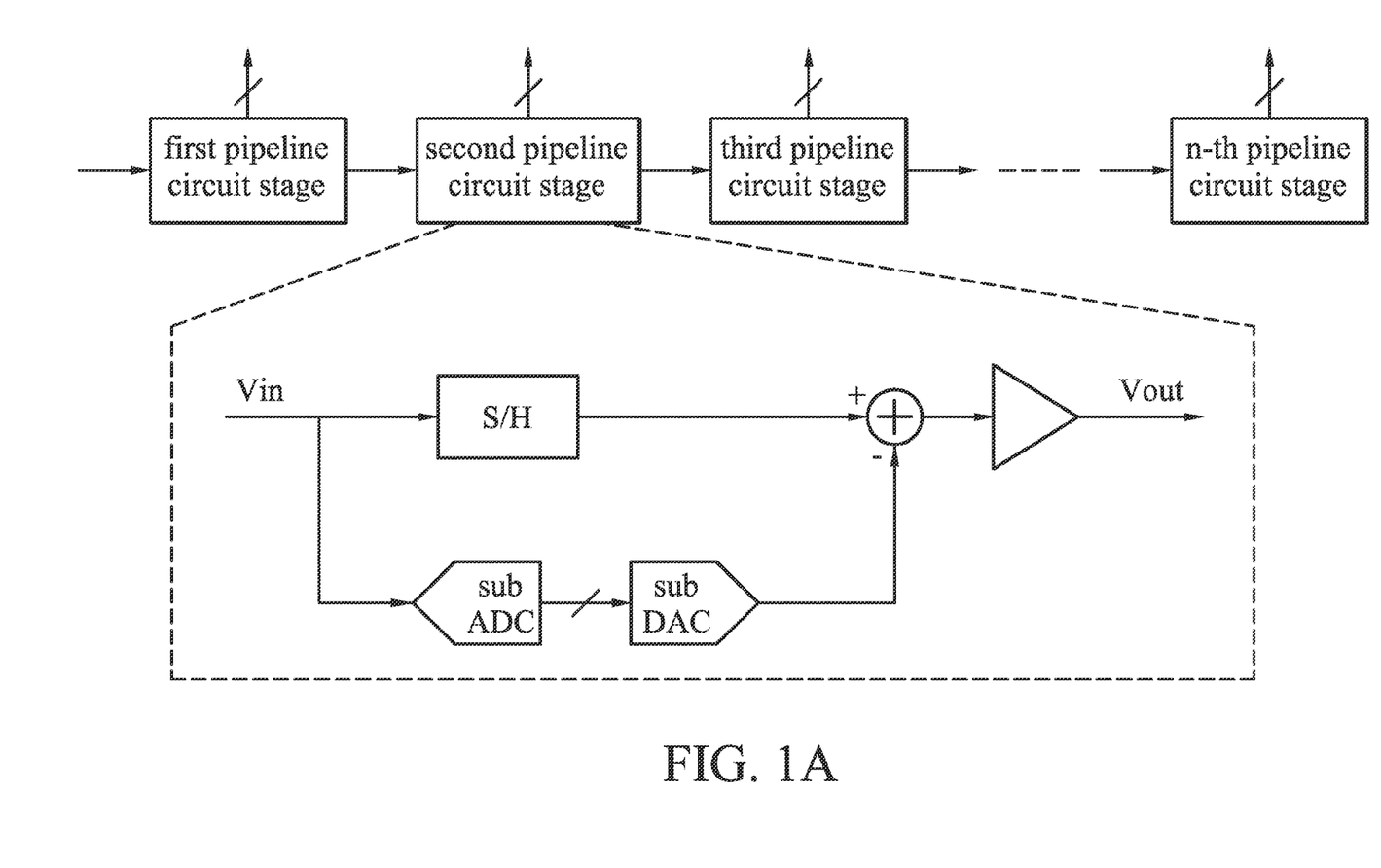
FIG. 1A is a schematic view showing a conventional pipeline analog-to-digital converter (ADC)

FIG. 1A is a schematic view showing a conventional pipeline ADC. As shown in FIG. 1A, a pipeline ADC comprises a multi-stage pipeline circuit structure. The second pipeline circuit stage is given as an example for illustration (refer to the portion surrounded by a dotted line in FIG. 1A). The second stage pipeline circuit comprises a sample-and-hold (referred to as S/H) circuit, a sub ADC circuit, a sub digital-to-analog converter (referred to as sub DAC) circuit, a subtracter circuit, and a residue amplifier circuit. The sub ADC circuit is used to quantify an analog-signal input quantity Vin, perform an analog-to-digital conversion to the quantification result, and output a digital quantity (that is a binary digital signal) corresponding to the analog-signal input quantity Vin. The sub DAC circuit processes the digital quantity output from the sub ADC circuit and outputs an analog-signal quantity. The subtracter circuit performs a subtraction operation on the analog-signal input quantity Vin and the analog-signal quantity output from the sub DAC. Then, through an amplifying operation performed by the residue amplifier circuit, a residue signal Vout of the analog-signal input quantity Vin is obtained. The residue signal Vout serves as the analog-signal input quantity of the next pipeline circuit stage and is processed by the next pipeline circuit stage. In each pipeline circuit stage, the S/H circuit, the sub DAC circuit, the subtracter circuit, and the residue amplifier circuit are generally called as a multiplying digital-to-analog converter (referred to as MDAC).

Figure 1B:
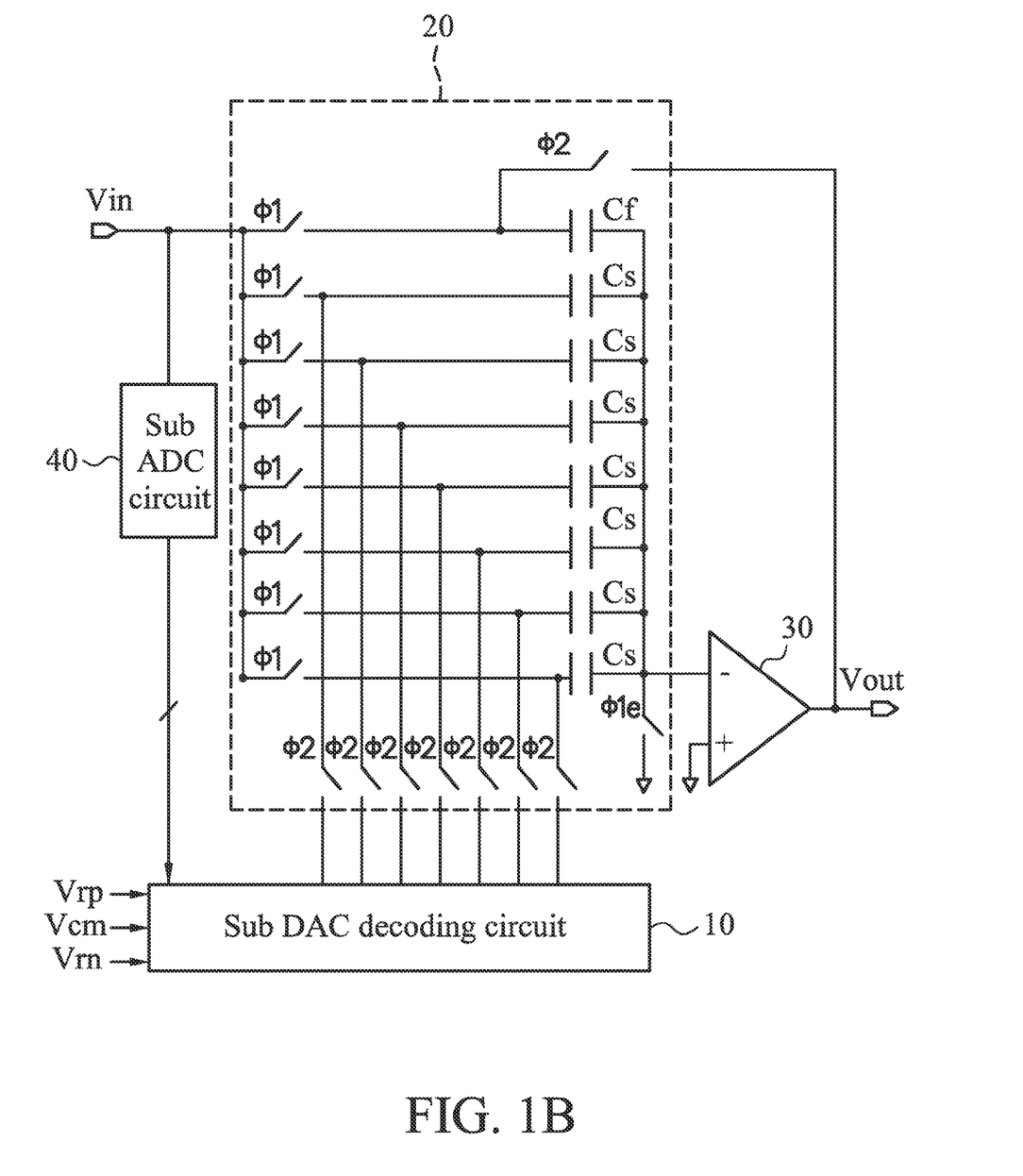
FIG. 1B is a schematic view showing a multiplying digital-to-analog converter (MDAC) in a conventional pipeline ADC.
Figure 1C:
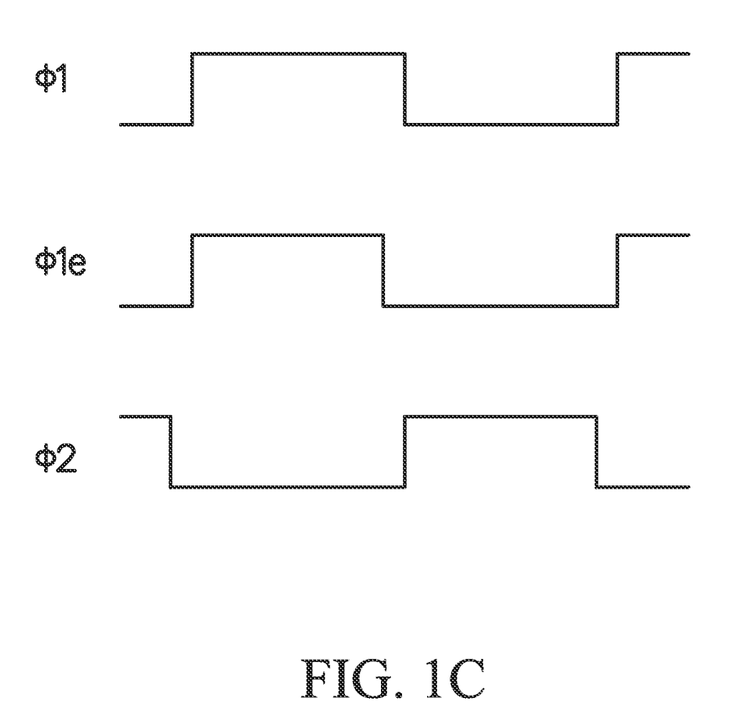
FIG. 1C shows a timing chart of switches in the MDAC of FIG. 1B.

FIG. 1B is a schematic view showing an MDAC in a conventional pipeline ADC. FIG. 1C shows a timing chart of switches in the MDAC of FIG. 1B. In a conventional pipeline ADC, for achieving sampling operations with various precision levels, sampling capacitors Cs with different numbers, feedback capacitors Cf with different numbers, sampling switches, decoding switches, and feedback switches have to be disposed in each MDAC. Specifically, as shown in FIG. 1B, an MDAC circuit comprises a sub DAC decoding circuit 10, a capacitor-switch circuit 20, and an operation amplifier circuit 30. The sub DAC decoding circuit 10 is coupled to an output terminal of the sub ADC circuit 40 of the current pipeline circuit stage and receives analog signals Vrp, Vcm, and Vrn, respectively through three input terminals. The switch-capacitor circuit 20 is coupled to an analog-signal input quantity Vin output from the previous pipeline circuit stage or S/H circuit, the sub DAC decoding circuit 10, and the operation amplifier circuit 30. The MDAC processes the analog-signal input quantity Vin and a digital quantity output from the sub ADC circuit 40 to obtain a residue signal of the analog-signal input quantity Vin. The residue signal is processed by the next pipeline circuit. The MDAC composed of the sub DAC decoding circuit 10, the capacitor-switch circuit 20, and the operation amplifier circuit 30 can carry out the functions of the S/H circuit, the sub DAC circuit, the subtracter circuit, and the residue amplifier shown in FIG. 1A. For achieving an MDAC circuit structure with 3.5 bits, the capacitor-switch circuit 20 requires seven sampling capacitors Cs, one feedback capacitor Cf, seven sampling switches $\phi1$ respectively coupled to the sampling capacitors Cs, seven decoding switches $\phi2$ respectively coupled to the sampling capacitors Cs, one switch $\phi1$ coupled to the feedback capacitor Cf, and one feedback switch coupled to the feedback capacitor Cf, wherein the feedback switch is one decoding switch $\phi2$. The sampling switches $\phi1$ are coupled to the analog-signal input quantity Vin required to be processed. The seven decoding switches $\phi2$ coupled to the sampling capacitor Cs are coupled to output terminals of the sub DAC decoding circuit 10. The feedback switch is coupled to the output terminal Vout of the operation amplifier circuit 30. The feedback capacitor Cf is coupled to the sampling switches Cs and an input terminal of the operation amplifier circuit 30. Further, the feedback capacitor Cf, the sampling switches Cs, and the input terminal of the operation amplifier circuit 30 are coupled to ground through a ground switch $\phi1e$. The sampling switches $\phi1$, the decoding switches $\phi2$, and the ground switch $\phi1e$ can operate according to the timing of FIG. 1C to control their turned-on and turned-off states thereby achieving the functions of the S/H circuit, the sub DAC circuit, the subtracter circuit, and the residue amplifier shown in FIG. 1A. Thus, the analog-signal input quantity Vin of the current pipeline circuit stage can be processed to obtain the residue signal of the analog-signal input quantity Vin.

In an MDAC of a conventional pipeline ADC, each sampling capacitor Cs has to be coupled to one sampling switch and one decoding switch. The total number of switches is large, and the sampling switches and the decoding switch have greater sizes. Thus, the switches of the MDAC occupy a large area in the entire circuit.

BRIEF SUMMARY OF THE INVENTION

An exemplary embodiment of the invention provides a multiplying digital-to-analog converter. The multiplying digital-to-analog converter is applied for a pipeline circuit in a pipeline analog-to-digital converter. The multiplying digital-to-analog converter comprises a sub digital-to-analog converter decoding circuit, a capacitor-switch circuit, and an operation amplifier circuit. An output terminal of the capacitor-switch circuit is coupled to an input terminal of the operation amplifier circuit. Input terminals of the capacitor-switch circuit are coupled to output terminals of the sub digital-to-analog converter decoding circuit and an analog-signal input quantity of the pipeline circuit. The capacitor-switch circuit comprises at least two sampling capacitor sets. The at least two sampling capacitor sets are coupled in parallel. The number of sampling capacitors in one of the at least two sampling capacitor sets is larger than or equal to two. Sampling capacitors in each of the at least two sampling capacitor sets are coupled in parallel. Each of the at least two sampling capacitor sets is coupled to the analog-signal input quantity through a sampling switch. Each of the at least two sampling capacitor sets is coupled to the corresponding output terminal of the sub digital-to-analog converter decoding circuit through a decoding switch. The sub digital-to-analog converter decoding circuit decodes a digital quantity and outputs a corresponding analog signal at each of the output terminals of the sub digital-to-analog converter decoding circuit, such that the corresponding analog signals at the output terminals of the sub digital-to-analog converter decoding circuit are applied to the respective sampling capacitor sets through the decoding switches and summed by the respective sampling capacitor sets to obtain an analog-signal quantity corresponding to the digital quantity. The digital quantity is a quantity which is obtained by processing the analog-signal input quantity by a sub analog-digital converter of the pipeline circuit.

Another exemplary embodiment of the invention provides a pipeline analog-to-digital converter. The pipeline analog-to-digital converter comprises a plurality of pipeline circuit stages, and each pipeline circuit stage comprises a sub analog-to-digital converter and a multiplying digital-to-analog converter. The multiplying digital-to-analog converter comprises a sub digital-to-analog converter decoding circuit, a capacitor-switch circuit, and an operation amplifier circuit. An output terminal of the capacitor-switch circuit is coupled to an input terminal of the operation amplifier circuit. Input terminals of the capacitor-switch circuit are coupled to output terminals of the sub digital-to-analog converter decoding circuit and an analog-signal input quantity of the pipeline circuit stage. The capacitor-switch circuit comprises at least two sampling capacitor sets. The at least two sampling capacitor sets are coupled in parallel. The number of sampling capacitors in one of the at least two sampling capacitor sets is larger than or equal to two. Sampling capacitors in each of the at least two sampling capacitor sets are coupled in parallel. Each of the at least two sampling capacitor sets is coupled to the analog-signal input quantity through a sampling switch. Each of the at least two sampling capacitor sets is coupled to the corresponding output terminal of the sub digital-to-analog converter decoding circuit through a decoding switch. The sub digital-to-analog converter decoding circuit decodes a digital quantity and outputs corresponding analog signal at each of the output terminals of the sub digital-to-analog converter decoding circuit, such that the corresponding analog signals at the output terminals of the sub digital-to-analog converter decoding circuit are applied to the respective sampling capacitor sets through the decoding switches and summed by the respective sampling capacitor sets to obtain an analog-signal quantity corresponding to the digital quantity. The digital quantity is a quantity which is obtained by processing the analog-signal input quantity by the sub analog-digital converter of the pipeline circuit stage.

A detailed description is given in the following embodiments with reference to the accompanying drawings.

BRIEF DESCRIPTION OF THE DRAWINGS

The invention is fully illustrated by the subsequent detailed description and the accompanying drawings, in which like references indicate similar elements, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In a current pipeline analog-to-digital converter (referred to as pipeline ADC), a multiplying digital-to-analog converter (referred to as MDAC) of each pipeline circuit stage comprises many switches which disadvantageously occupy a large area. Thus, the invention provides an exemplary embodiment of an MDAC with a new structure. Sampling switches in the MDAC can share switches, thereby decreasing the number of switches in the MDAC and reducing the occupied area. The MDAC comprises a sub digital-to-analog converter decoding circuit (referred to as sub DAC decoding circuit), a capacitor-switch circuit, and an operation amplifier circuit. An output terminal of the capacitor-switch circuit is coupled to an input terminal of the operation amplifier circuit. Input terminals of the capacitor-switch circuit are coupled to output terminals of the sub DAC decoding circuit and an analog-signal input quantity of the pipeline circuit. The capacitor-switch circuit comprises at least two sampling capacitor sets. The at least two sampling capacitor sets are coupled in parallel. The number of sampling capacitors in one of the at least two sampling capacitor sets is larger than or equal to two. Sampling capacitors in each of the at least two sampling capacitor sets are coupled in parallel. Each of the at least two sampling capacitor sets is coupled to the analog-signal input quantity through a sampling switch. Each of the at least two sampling capacitor sets is coupled to the corresponding output terminal of the sub DAC decoding circuit through a decoding switch. The sub DAC decoding circuit decodes a digital quantity and outputs a corresponding analog signal at each of the output terminals of the sub DAC decoding circuit, such that the corresponding analog signals at the output terminals of the sub DAC decoding circuit are applied to the respective sampling capacitor sets through the decoding switches, and an analog-signal input quantity and the analog signals output by the sub DAC decoding circuit are summed by the sampling capacitor sets to obtain a residue signal of the analog-signal input quantity. The obtained residue signal is provided to the next pipeline circuit stage and is processed by the next pipeline circuit. In the following, a 3.5-bit MDAC is given as an example to illustrate the invention.

Figure 2:
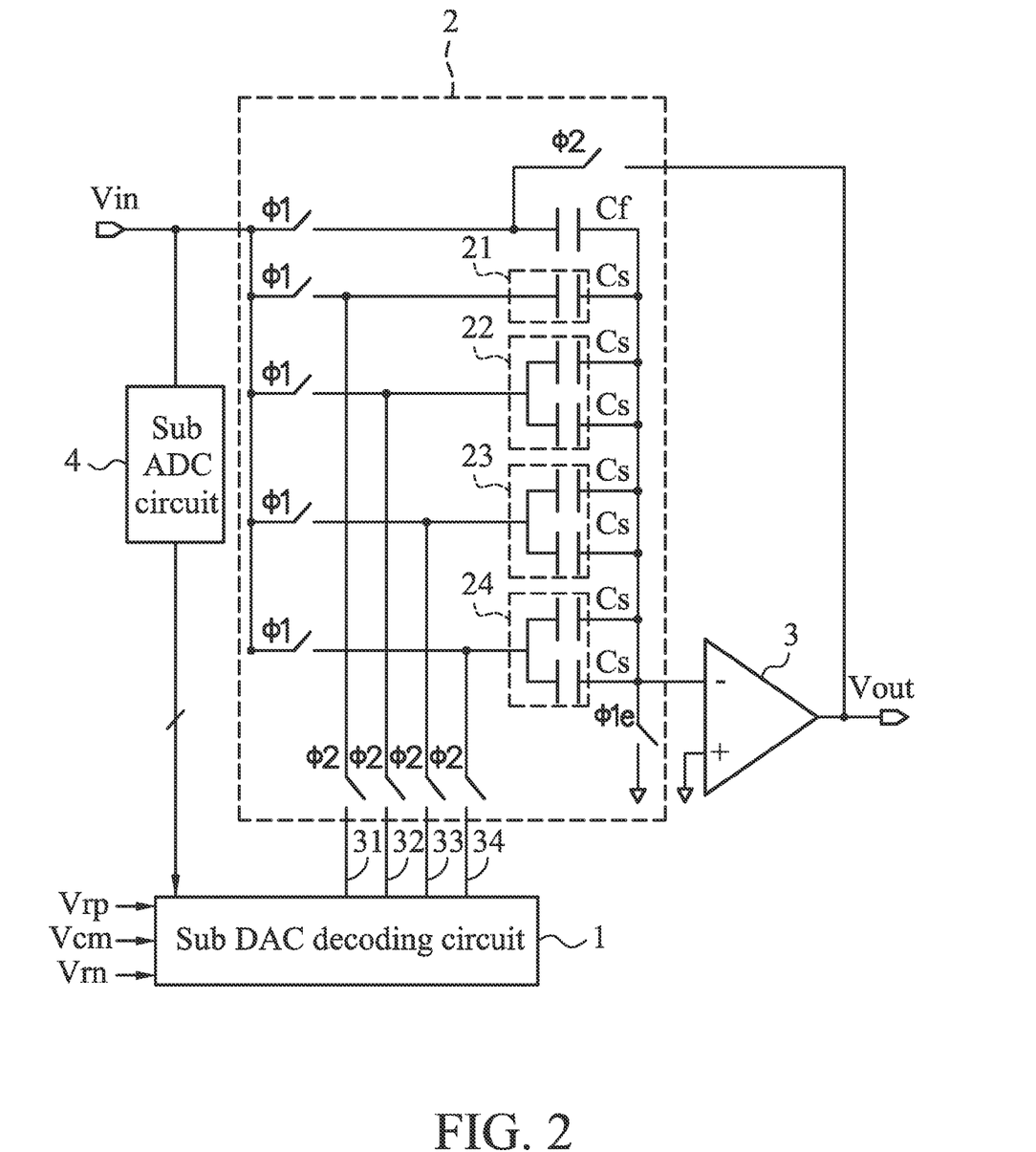
FIG. 2 shows a 3.5-bit MDAC according to the first embodiment of the invention.

First Embodiment:

FIG. 2 shows a 3.5-bit MDAC according to the first embodiment. The MDAC of the embodiment can achieve analog-to-digital conversion with 3.5-bit precision. As shown in FIG. 2, the MDAC comprises a sub DAC decoding circuit 1, a capacitor-switch circuit 2, and an operation amplifier circuit 3. The operation amplifier circuit 3 has two input terminals and one output terminal. One of the two input terminals of the operation amplifier circuit 3 is coupled to an output terminal of the capacitor-switch circuit 2, and the other thereof is coupled to ground. Input terminals of the capacitor-switch circuit 2 are coupled to an analog-signal input quantity Vin and the sub DAC decoding circuit 1. The sub DAC decoding circuit 1 is coupled to an output terminal of a sub ADC circuit 4 of the current pipeline circuit stage. The sub DAC decoding circuit 1 receives analog signals Vrp, Vcm, and Vrn, respectively through three input terminals. An input terminal of the sub ADC circuit is coupled to the analog-signal input quantity Vin.

In the embodiment, the number of capacitor sets is four, and the numbers of sampling capacitors in the four capacitor sets are equal to one, two, two, and two, respectively. As shown in FIG. 2, the capacitor-switch circuit 2 may comprises a first sampling capacitor set 21, a second sampling capacitor set 22, a third sampling capacitor set 23, and a fourth sampling capacitor set 24. The numbers of sampling capacitors in the first sampling capacitor set 21, the second sampling capacitor set 22, the third sampling capacitor set 23, and the fourth sampling capacitor set 24 are equal to one, two, two, and two, respectively. The four sampling capacitor sets 21-24 are coupled in parallel. Each sampling capacitor set is coupled to the analog-signal input quantity Vin through one sampling switch φ1. Each sampling capacitor set is coupled to one output terminal of the sub DAC decoding circuit 1 through one decoding switch φ2. The sub DAC decoding circuit 1 of the embodiment has four output terminals: a first output terminal 31, a second output terminal 32, a third output terminal 33, and an fourth output terminal 34. The first output terminal 31, the second output terminal 32, the third output terminal 33, and the fourth output terminal 34 are coupled to the first sampling capacitor set 21, the second sampling capacitor set 22, the third sampling capacitor set 23, and the fourth sampling capacitor set 24 through the decoding switches φ2, respectively.

In the embodiment, as shown in FIG. 2, the capacitor-switch circuit 2 further comprises a feedback capacitor Cf. One terminal of the feedback capacitor Cf is coupled to the analog-signal input quantity Vin through one sampling switch φ1 and to the output terminal of the operation amplifier circuit 3 through the feedback switch (the decoding switch φ2). The other terminal of the feedback capacitor Cf is coupled to the input terminal of the operation amplifier circuit 3 which is coupled to the output terminal of the capacitor-switch circuit 2. The feedback capacitor Cf and the sampling capacitors Cs are coupled in parallel.

In the embodiment, by controlling the sampling switches φ1 and the decoding switches φ2 of the capacitor-switch circuit 2, the operation switching can be switched between the sampling operation and the amplifying operation, such that the analog-signal input quantity Vin is processed to obtain a residue signal Vout of the analog-signal input quantity Vin. Specifically, in a first time period, the capacitor-switch circuit 2 is switched to the sampling operation. At this time, all of the sampling switches φ1 are turned on, and all of the decoding switches φ2 are turned off, such that the sampling capacitors Cs and the feedback capacitor Cf can be charged by the analog-signal input quantity Vin, respectively. In the first period, the analog-signal input quantity Vin is further quantified by the sub ADC circuit 4. After the analog-to-digital conversion, the sub ADC circuit 4 outputs a digital quantity corresponding to the analog-signal input quantity Vin. In a second time period, the capacitor-switch circuit 2 is switched to the amplifying operation. At this time, all of the sampling switches φ1 are turned off, and all of the decoding switches φ2 are turned on, such that the sampling capacitors Cs and the feedback capacitor Cf can keep the analog-signal input quantity Vin, respectively. The sub DAC decoding circuit 1 performs a decoding process to the digital quantity output from the sub ADC circuit 4. Then, the sub DAC decoding circuit 1 outputs the analog signals Vrp, Vcm, or Vrn through each of the output terminals of the sub DAC decoding circuit 1, and the analog signal Vrp, Vcm, or Vrn output from each of the output terminals of the sub DAC decoding circuit 1 is applied to each of the sampling capacitor set through the respective decoding switch φ2. Accordingly, after the analog signals output from the respective output terminals of the sub DAC decoding circuit 1 are summed by the respective sampling capacitors Cs, an analog-signal quantity corresponding to the digital quantity is obtained. The analog signals Vrp and Vrn are reference voltages of the sub DAC decoding circuit 1, and the analog signal Vcm is a common voltage, wherein Vcm=(Vrp+Vrn)/2. One skilled in the art should know that after the analog signals output from the respective output terminals of the sub DAC decoding circuit 1 are summed by the respective sampling capacitors Cs, the obtained analog-signal quantity corresponding to the digital quantity is a quantity which is obtained by performing digital-to-analog conversion to the digital quantity. The sub DAC decoding circuit 1, the decoding switches φ2, and the sampling capacitor(s) Cs can work together to perform the digital-to-analog conversion of the sub DAC circuit shown in FIG. 1A.

In the embodiment, the sub DAC decoding circuit 1 can decode the digital quantity input at an input terminal to control the analog signal output by each of the output terminals of the sub DAC decoding circuit 1 to be Vrp, Vrn, or Vcm, which ensures that the analog-signal quantity corresponding to the digital quantity is obtained after the analog signals output from the respective output terminals of the sub DAC decoding circuit 1 are summed by the respective sampling capacitors Cs. Specifically, for a 3.5-bit MDAC, the input/output equation is represented by Vout=8Vin+(−7~+7)*Vr, wherein Vr=Vrp−Vrn. By controlling the analog signals output by the output terminals of the sub DAC decoding circuit 1, an output Vout with a value in the range of (8Vin−7Vr)~(8Vin+7Vr) is obtained through the capacitor-switch circuit. −7Vr~+7Vr represents the digital quantity input at the input terminal of the sub DAC decoding circuit 1. The digital quantity which is input to the input terminal each time is decoded to control the analog signals output through the output terminals, and the analog signals are summed by the respective sampling capacitors Cs to obtain the analog-signal quantity corresponding to the digital quantity.

Specifically, −7Vr~+7Vr in the above equation can be achieved by the following manners:
Vout=8Vin−7*Vr, wherein −7=−1−2−2−2;
Vout=8Vin−6*Vr, wherein −6=0−2−2−2;
Vout=8Vin−5*Vr, wherein −5=+1−2−2−2 or −5=−1+0−2−2;
Vout=8Vin−4*Vr, wherein −4=0+0−2−2;
Vout=8Vin−3*Vr, wherein −3=−1+2−2−2 or −3=+1+0−2−2 or −3=−1+0+0−2;
Vout=8Vin−2*Vr, wherein −2=0+0+0−2;
Vout=8Vin−1*Vr, wherein −1=−1+0+0+0 or −1=−1+2−2+0; and
Vout=8Vin+0*Vr, wherein 0=0+0+0+0;
wherein −1 represents that the sampling capacitor set has one sampling capacitor Cs and the analog signal output by the output terminal of the sub DAC decoding circuit which is coupled to the sampling capacitor set through the corresponding decoding switch is Vrp; +1 represents that the sampling capacitor set has one sampling capacitor Cs and the analog signal output by the output terminal of the sub DAC decoding circuit which is coupled to the sampling capacitor set through the corresponding decoding switch is Vrn; −2 represents that the sampling capacitor set has two sampling capacitors Cs and the analog signal output by the output terminal of the sub DAC decoding circuit which is coupled to the sampling capacitor set through the corresponding decoding switch is Vrp; 0 represents that the analog signal output by the output terminal of the sub DAC decoding circuit which is coupled to the sampling capacitor set through the corresponding decoding switch is Vcm; and +2 represents that the sampling capacitor set has two sampling capacitors Cs and the analog signal output by the output terminal of the sub DAC decoding circuit which is coupled to the sampling capacitor set through the corresponding decoding switch is Vrn. 0~+7Vr can be achieved by adjusting the analog signal which is coupled to each of the respective sampling capacitor sets through the corresponding decoding switch. For example, the sampling capacitor(s) Cs, which is originally coupled to the analog signal Vrp through the corresponding decoding switch, is changed to be coupled to the analog signal Vrn through the corresponding the corresponding decoding switch.

According to the above embodiment, the sub DAC decoding circuit 1 decodes the input digital quantity according to the above equations to control each of the output terminals of the sub DAC decoding circuit 1 to output the corresponding analog signal, such that, the analog-signal quantity corresponding to the digital quantity is obtained after the analog signals output from the respective output terminals of the sub DAC decoding circuit 1 are applied to and summed by the respective sampling capacitors Cs. For example, the analog signal corresponding to the input digital quantity is −3Vr. After the digital quantity a is decoded, the first output terminal 31, the second output terminal 32, the third output terminal 33, and the fourth output terminal 34 of the sub DAC decoding circuit 1 output the analog signals Vrp, Vrn, Vrp, and Vrp, respectively. The output analog signals are applied to the respective sampling capacitors Cs through the decoding switches φ2 and summed by the corresponding sampling capacitors Cs to obtain the analog-signal quantity of −3Vr. Then, the analog-signal quantity of −3Vr and the analog-signal input quantity Vin kept in the sampling capacitors Cs are summed to obtain Vout=8Vin−3Vr.

In the embodiment, the sub DAC decoding circuit 1 serves as a decoding circuit by using various logic switch circuits to decode the input digital quantity for outputting the corresponding analog signals. Specifically, the sub DAC decoding circuit 1 can decode the input digital quantity according to the above manner of −7Vr~+7Vr to control each of the output terminals of the sub DAC decoding circuit 1 to output the analog signal Vrp, Vrn, or Vcm. Accordingly, the analog signals output by the output terminals are summed to obtain the analog-signal quantity corresponding to the digital quantity. The above implementation process is similar to or the same as common decoding circuits.

As the above describes, in the MDAC of the embodiment, the sampling capacitors are grouped into several sampling capacitor sets, such that each sampling capacitor set is coupled to one sampling switch and one decoding switch. Compared with the conventional 3.5-bit MDAC, the number of sampling switches is decreased to five from eight, and the number of decoding switches is decreased to four from seven, such that the total number of switches in the MDAC is decreased, and the area in the entire circuit occupied by the switches is reduced.

Figure 3:
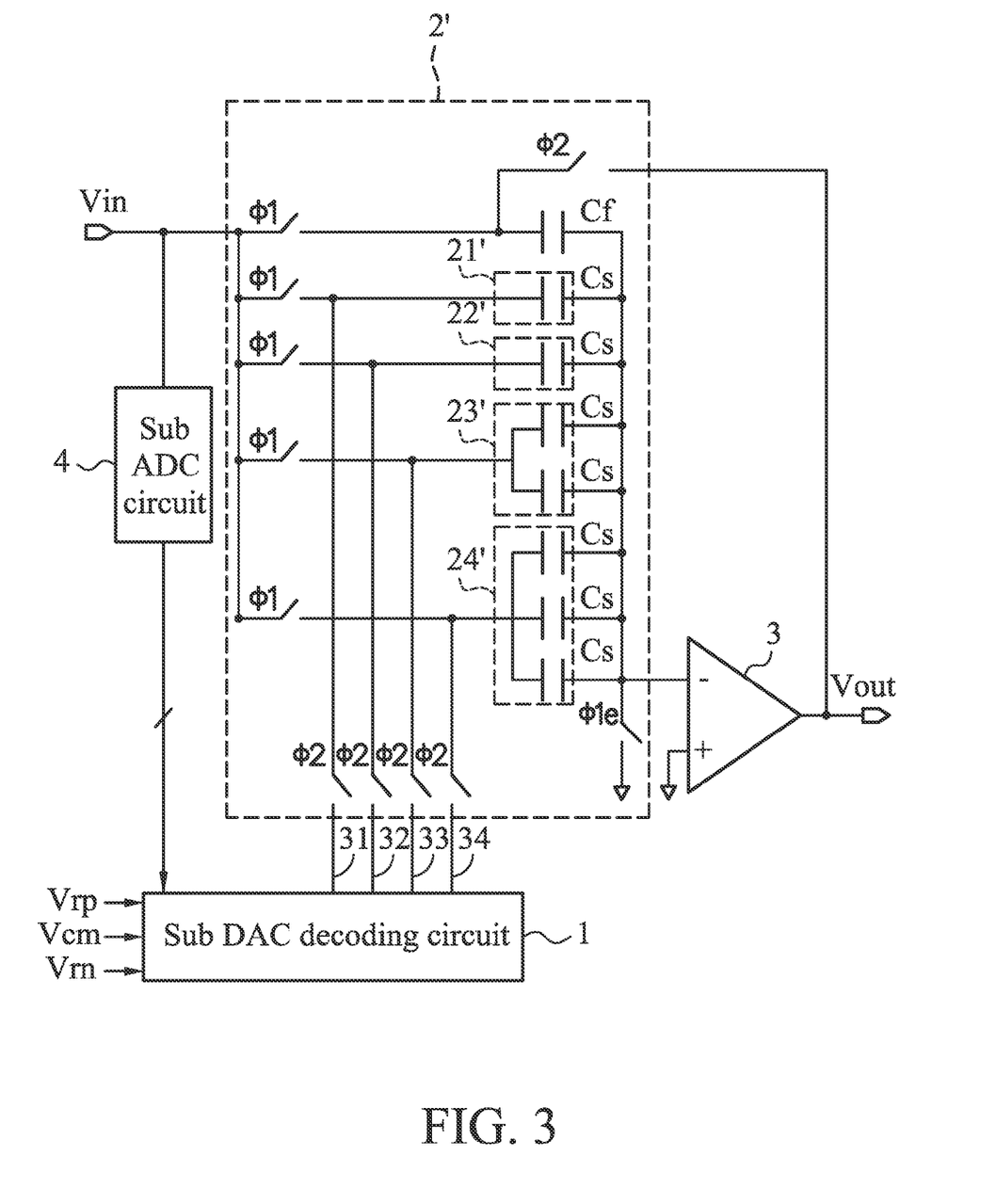
FIG. 3 shows a 3.5-bit MDAC according to the second embodiment of the invention.

Second Embodiment:

FIG. 3 shows a 3.5-bit MDAC according to the second embodiment. The difference between the 3.5-bit MDACs of FIGS. 2 and 3 is that, in the 3.5-bit MDAC of FIG. 3, the number of sampling capacitors Cs in the four capacitor sets are equal to one, one, two, and three, respectively. However, the 3.5-bit MDACs of FIGS. 2 and 3 can achieve the same result. Specifically, as shown in FIG. 3, in the capacitor-switch circuit 2', the numbers of sampling capacitors in the first sampling capacitor set 21', the second sampling capacitor set 22', the third sampling capacitor set 23', and the fourth sampling capacitor set 24' are equal to one, one, two, and three, respectively. The input/output equation of the 3.5-bit MDAC is represented by:

Vout=8Vin−7*Vr, wherein −7=−1−1−2−3;
Vout=8Vin−6*Vr, wherein −6=0−1−2−3;
Vout=8Vin−5*Vr, wherein −5=−1−1−0−3 or −5=−1+1−2−3 or −5=0+0−2−3;
Vout=8Vin−4*Vr, wherein −4=−1+0+0−3 or −4=−1−1−2+0 or −4=+1+0−2−3;
Vout=8Vin−3*Vr, wherein −3=−1+0−2+0 or −3=+0+0+0−3 or −3=+1+1−2−3;
Vout=8Vin−2*Vr, wherein −2=−1−1+0+0 or −2=+1−1−2+0 or 2=+1+0+0−3; and
Vout=8Vin−1*Vr, wherein −1=−1+0+0+0 or −1=0−1+0+0 or −1=+1+0−2+0 or −1=+1−1+2−3, wherein, −3 represents that the sampling capacitor set has three sampling capacitors Cs and the analog signal output by the output terminal of the sub DAC decoding circuit which is coupled to the sampling capacitor set through the corresponding decoding switch is Vrp.

In the embodiment, the sub DAC decoding circuit 1 decodes the input digital quantity according to the above equations to control each of the four output terminals of the sub DAC decoding circuit 1 to output the corresponding analog signal, such that the analog-signal quantity corresponding to the digital quantity is obtained after the analog signals output from the four output terminals of the sub DAC decoding circuit 1 are applied to and summed by the respective sampling capacitors Cs. Then, the obtained analog-signal quantity and the analog-signal input quantity Vin kept in the sampling capacitors Cs are summed to obtain the residue signal Vout of the analog-signal input quantity Vin.

Figure 4:
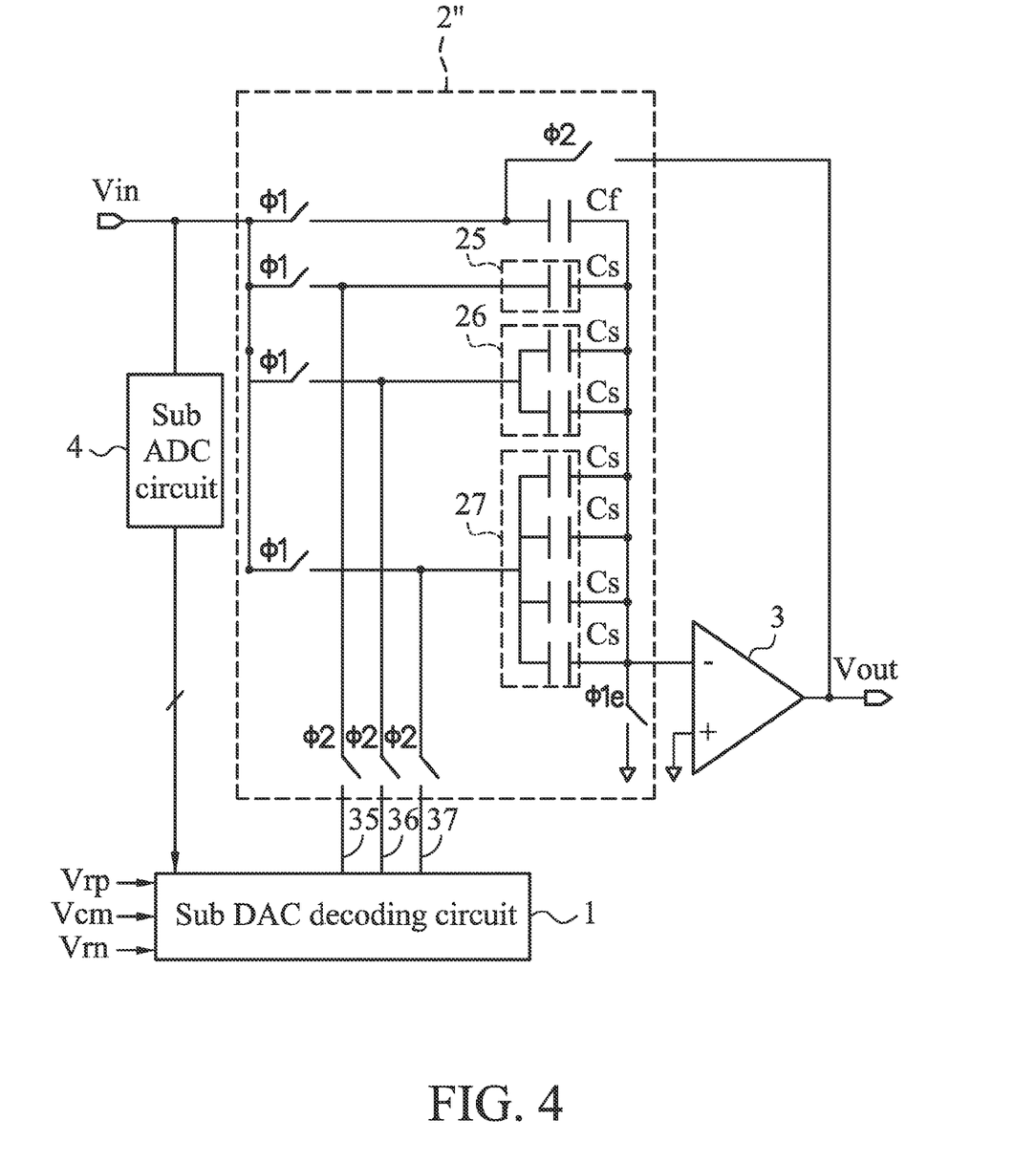
FIG. 4 shows a 3.5-bit MDAC according to the third embodiment of the invention.

Third Embodiment:

FIG. 3 shows a 3.5-bit MDAC according to the third embodiment. The difference between the 3.5-bit MDACs of FIGS. 3 and 4 is that, in the 3.5-bit MDAC of FIG. 4, the number of sampling capacitor sets is equal to three, and the number of sampling capacitors Cs in the three capacitor sets are equal to one, two, and four, respectively. Accordingly, four sampling switches are required, and three decoding switches are required. Specifically, as shown in FIG. 4, in the capacitor-switch circuit 2" comprises a fifth sampling capacitor set 25, a sixth sampling capacitor set 26, and a seventh sampling capacitor set 27. The numbers of the sampling capacitors in the fifth sampling capacitor set 25, the sixth sampling capacitor set 26, and the seventh sampling capacitor set 27 are equal to one, two, and four, respectively. The sub DAC decoding circuit 1 has three output terminals; a fifth output terminal 35, a sixth output terminal 36, and a seventh output terminal 37. The fifth output terminal 35, the sixth output terminal 36, and the seventh output terminal 37 are coupled to the fifth sampling capacitor set 25, the sixth sampling capacitor set 26, and the seventh sampling capacitor set 27 through the decoding switches φ2, respectively.

In the embodiment, the input/output equation of the 3.5-bit MDAC is represented by:

Vout=8Vin−7*Vr, wherein −7=−1−2−4;
Vout=8Vin−6*Vr, wherein −6=+0−2−4;
Vout=8Vin−5*Vr, wherein −5=−1+0−4 or −5=+1−2−4;
Vout=8Vin−4*Vr, wherein −4=0+0−4;
Vout=8Vin−3*Vr, wherein −3=−1−2+0 or −3=+1+0−4 or −3=−1+2−4;
Vout=8Vin−2*Vr, wherein −2=0−2+0 or −2=0+2−4; and
Vout=8Vin−1*Vr, wherein −1=−1+0+0 or −1=+1+2−4, wherein, −4 represents that the sampling capacitor set has four sampling capacitors Cs and the analog signal output by the output terminal of the sub DAC decoding circuit which is coupled to the sampling capacitor set through the corresponding decoding switch is Vrp.

In the embodiment, the sub DAC decoding circuit 1 decodes the input digital quantity according to the above equations to control each of the three output terminals of the sub DAC decoding circuit 1 to output the corresponding analog signal, such that the analog-signal quantity corresponding to the digital quantity is obtained after the analog signals output from the three output terminals of the sub DAC decoding circuit 1 are applied to and summed by the respective sampling capacitors Cs. Then, the obtained analog-signal quantity and the analog-signal input quantity Vin kept in the sampling capacitors Cs are summed to obtain the residue signal Vout of the analog-signal input quantity Vin.

Figure 5:
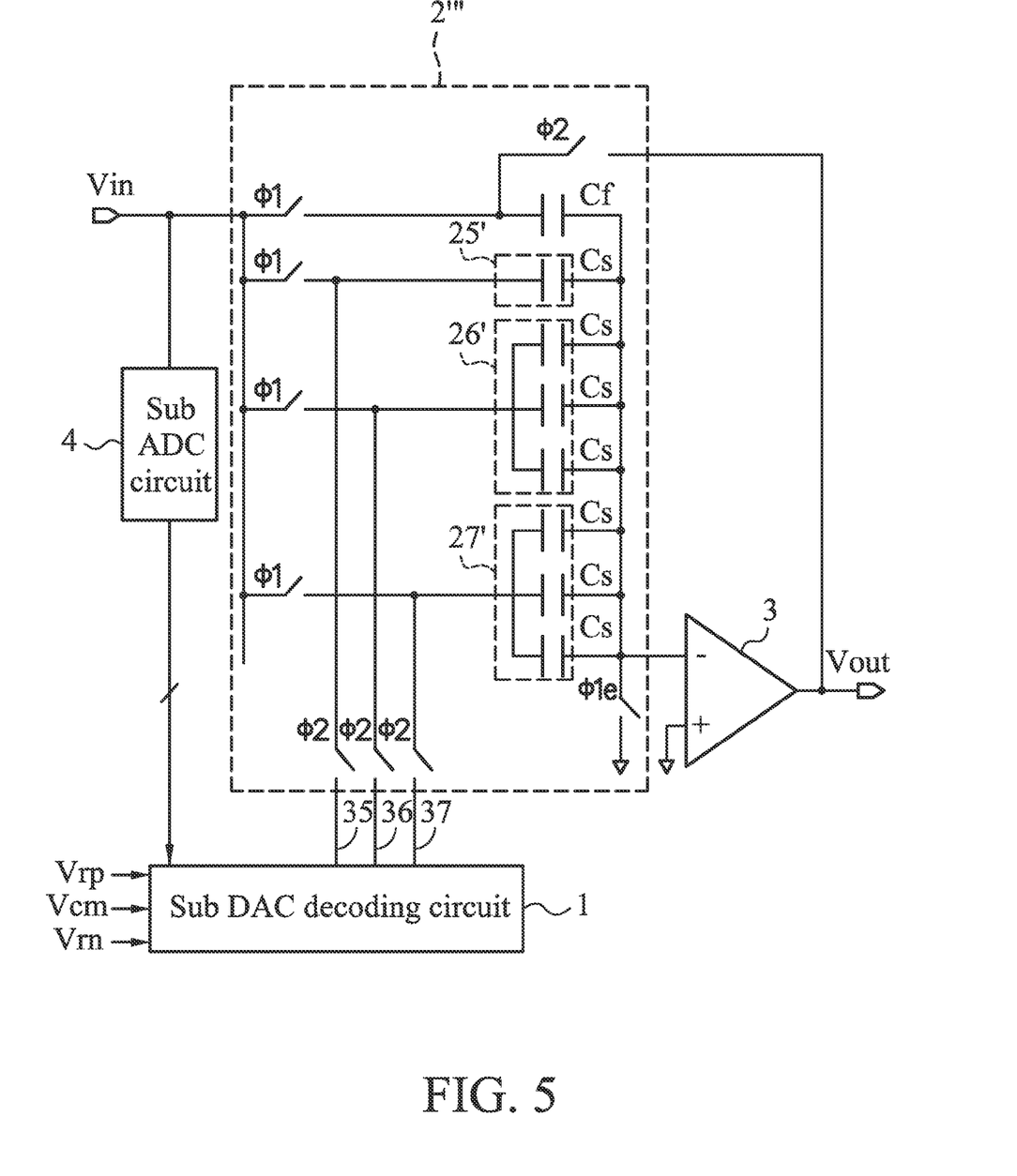
FIG. 5 shows a 3.5-bit MDAC according to the fourth embodiment of the invention.

Fourth Embodiment:

FIG. 5 shows a 3.5-bit MDAC according to the fourth embodiment. The difference between the 3.5-bit MDACs of FIGS. 4 and 5 is that, in the 3.5-bit MDAC of FIG. 5, the number of sampling capacitors Cs in the three capacitor sets are equal to one, three, and three, respectively. However, the 3.5-bit MDACs of FIGS. 4 and 5 can achieve the same result. Specifically, as shown in FIG. 5, in the capacitor-switch circuit 2''', the numbers of sampling capacitors in the fifth sampling capacitor set 25', the sixth sampling capacitor set 26', and the seventh sampling capacitor set 27' are equal to one, three and three, respectively. The input/output equation of the 3.5-bit MDAC is represented by:

Vout=8Vin−7*Vr, wherein −7=−1−3−3;
Vout=8Vin−6*Vr, wherein −6=+0−3−3;
Vout=8Vin−5*Vr, wherein −5=+1−3−3;
Vout=8Vin−4*Vr, wherein −4=−1+0−3;
Vout=8Vin−3*Vr, wherein −3=0+0−3;
Vout=8Vin−2*Vr, wherein −2=+1−3+0; and
Vout=8Vin−1*Vr, wherein −1=−1+0+0 or −1=−1+3−3, wherein, +3 represents that the sampling capacitor set has three sampling capacitors Cs and the analog signal output by the output terminal of the sub DAC decoding circuit which is coupled to the sampling capacitor set through the corresponding decoding switch is Vrn.

In the embodiment, the sub DAC decoding circuit 1 decodes the input digital quantity according to the above equations to control each of the three output terminals of the sub DAC decoding circuit 1 to output the corresponding analog signal, such that the analog-signal quantity corresponding to the digital quantity is obtained after the analog signals output from the three output terminals of the sub DAC decoding circuit 1 are applied to and summed by the respective sampling capacitors Cs. Then, the obtained analog-signal quantity and the analog-signal input quantity Vin kept in the sampling capacitors Cs are summed to obtain the residue signal Vout of the analog-signal input quantity Vin.

One skilled in the art should understand that according to application requirements, the sampling capacitors can be appropriately grouped into several sampling capacitor sets, such that one sampling capacitor set is coupled to only one sampling switch and only one decoding switches. Moreover, the output operation of the sub DAC decoding circuit is controlled, such that the output terminals of the sub DAC decoding circuit can apply the respective analog signals to the respective sampling capacitors through the corresponding decoding switches, and the applied analog signals are summed by the respective sampling capacitors Cs to obtain the analog-signal quantity corresponding digital quantity at the input terminal of the sub DAC decoding circuit.

One skilled in the art should understand that compared with the conventional MDAC where each sampling capacitor is coupled to one sampling switch and one decoding switch, more switches are saved for a pipeline circuit with a higher precision level (such as an MDAC with 4.5-bit or 5.5-bit precision) according to the invention, thereby effectively reducing the area in the entire circuit occupied by the switches. The pipeline circuit with a higher precision level is implemented to have the same structure of the 3.5-bit MDAC. The MDAC in the above the embodiments may be a single-end MDAC or a differential-end MDAC.

An exemplary embodiment of a pipeline ADC is also provided. The pipeline ADC comprises a plurality of pipeline circuit stages which are coupled in series, as shown in FIG. 1A. Each pipeline circuit stage comprises a sub ADC and an MDAC. The MDAC in each pipeline circuit stage is implemented by the MDAC of the above embodiments. The structure of the MDAC is shown in the description of the above embodiment, thus is omitted here.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multiplying digital-to-analog converter applied for a pipeline circuit in a pipeline analog-to-digital converter, the multiplying digital-to-analog converter comprising:
   a sub digital-to-analog converter decoding circuit;
   a capacitor-switch circuit; and
   an operation amplifier circuit, wherein an output terminal of the capacitor-switch circuit is coupled to an input terminal of the operation amplifier circuit, and input terminals of the capacitor-switch circuit are co pled to output terminals of the sub digital-to-analog converter decoding circuit and an analog-signal input quantity of the pipeline circuit,
   wherein the capacitor-switch circuit comprises:
   at least two sampling capacitor sets, wherein the at least two sampling capacitor sets are coupled in parallel, and the number of sa piing capacitors in one of the at least two sampling capacitor sets is larger than or equal to two, and the sampling capacitors in each of the at least two sampling capacitor sets are coupled in parallel,
   wherein each of the at least two sampling capacitor sets is coupled to the analog-signal input quantity through one corresponding sampling switch, and the sampling capacitors in the same sampling capacitor set connect to/disconnect from the analog-signal input quantity simultaneously, wherein each of the at least two sampling capacitor sets is coupled to the corresponding output terminal of the sub digital-to-analog converter decoding circuit through one corresponding decoding switch, and the sampling capacitors in the same sampling capacitor set connect to/disconnect from the corresponding output terminal of the sub digital-to-analog converter decoding circuit simultaneously, wherein the sub digital-to-analog converter decoding circuit decodes a digital quantity and outputs a corresponding analog signal at each of the output terminals of the sub digital-to-analog converter decoding circuit, such that the corresponding analog signals at the output terminals of the sub digital-to-analog converter decoding circuit are applied to the respective sampling capacitor sets through the decoding switches and summed by the respective sampling capacitor sets to obtain an analog-signal quantity corresponding to the digital quantity, and wherein the digital quantity is a quantity which is obtained by processing the analog-signal input quantity by a sub analog-digital converter of the pipeline circuit.

2. The multiplying digital-to-analog converter as claimed in claim 1, wherein a precision level of the multiplying digital-to-analog converter is 3.5 bits.

3. The multiplying digital-to-analog converter as claimed in claim 1, wherein the number of the sampling capacitor sets is equal to four, and the numbers of sampling capacitors in the four sampling capacitor sets are equal to one, two, two, and two, respectively, or equal to one, one, two, and three, respectively.

4. The multiplying digital-to-analog converter as claimed in claim 3, wherein the sub digital-to-analog converter decoding circuit has four output signals corresponding to the sampling capacitor sets.

5. The multiplying digital-to-analog converter as claimed in claim 1, wherein the number of the sampling capacitor sets is equal to three, and the numbers of sampling capacitors in the three sampling capacitor sets are equal to one, two, and four, respectively, or equal to one, three, and three, respectively.

6. The multiplying digital-to-analog converter as claimed in claim 5, wherein the sub digital-to-analog converter decoding circuit has three output signals corresponding to the sampling capacitor sets.

7. A pipeline analog-to-digital converter comprising a plurality of pipeline circuit stages in series, wherein each pipeline circuit stage comprises a sub analog-to-digital converter and a multiplying digital-to-analog converter, and the multiplying digital-to-analog converter comprising:

a sub digital-to-analog converter decoding circuit;

a capacitor-switch circuit; and an operation amplifier circuit, wherein an output terminal of the capacitor-switch circuit, is coupled to an input terminal of the operation amplifier circuit, and input terminals of the capacitor-switch circuit are coupled to output terminals of the sub digital-to-analog converter decoding circuit and an analog-signal input quantity of the pipeline circuit stage, wherein the capacitor-switch circuit comprises:

at least two sampling capacitor sets, wherein the at least two sampling capacitor sets are coupled in parallel, the number of sampling capacitors in one of the at least two sampling capacitor sets is larger than or equal to two, and sampling capacitors in each of the at least two sampling capacitor sets are coupled in parallel, wherein each of the at least two sampling capacitor sets is coupled to the analog-signal input quantity through one corresponding sampling switch, and the sampling capacitors in the same sampling capacitor set connect to/disconnect from the analog-signal input quantity simultaneously, wherein each of the at least two sampling capacitor sets is coupled to the corresponding output terminal of the sub digital-to-analog converter decoding circuit through one corresponding decoding switch, and the sampling capacitors in the same sampling capacitor set connect to/disconnect from the corresponding output terminal of the sub digital-to-analog converter decoding circuit simultaneously, wherein the sub digital-to-analog converter decoding circuit decodes a digital quantity and outputs a corresponding analog signal at each of the output terminals of the sub digital-to-analog converter decoding circuit, such that the corresponding analog signals at the output terminals of the sub digital-to-analog converter decoding circuit are applied to the respective sampling capacitor sets through the decoding switches and summed by the respective sampling capacitor sets to obtain an analog-signal quantity corresponding to the digital quantity, and wherein the digital quantity is a quantity which is obtained by processing the analog-signal input quantity by the sub analog-digital converter of the pipeline circuit stage.

8. The pipeline analog-to-digital converter as claimed in claim 7, wherein a precision level of the multiplying digital-to-analog converter is 3.5 bits.

9. The pipeline analog-to-digital converter as claimed in claim 7, wherein the number of the sampling capacitor sets is equal to four, and the numbers of sampling capacitors in the four sampling capacitor sets are equal to one, two, two, and two, respectively, or equal to one, one, two, and three, respectively.

10. The pipeline analog-to-digital converter as claimed in claim 9, wherein the sub digital-to-analog converter decoding circuit has four output signals corresponding to the sampling capacitor sets.

11. The pipeline analog-to-digital converter as claimed in claim 7, wherein the number of the sampling capacitor sets is equal to three, and the numbers of sampling capacitors in the three sampling capacitor sets are equal to one, two, and four, respectively, or equal to one, three, and three, respectively.

12. The pipeline analog-to-digital converter as claimed in claim 11, wherein the sub digital-to-analog converter decoding circuit has three output signals corresponding to the sampling capacitor sets.

* * * * *